United States Patent [19]
Bhatia et al.

[11] Patent Number: 5,933,323
[45] Date of Patent: Aug. 3, 1999

[54] ELECTRONIC COMPONENT LID THAT PROVIDES IMPROVED THERMAL DISSIPATION

[75] Inventors: Rakesh Bhatia, San Jose; Karen M. Regis, Mountain View, both of Calif.

[73] Assignee: Intel Corporation, Santa Clara, Calif.

[21] Appl. No.: 08/964,908

[22] Filed: Nov. 5, 1997

[51] Int. Cl.$^6$ .................................................... H05K 7/20
[52] U.S. Cl. ...................... 361/700; 165/80.2; 165/80.5; 174/15.2; 257/715
[58] Field of Search .................................... 165/80.4, 80.5, 165/104.33, 104.26; 174/15.1, 15.2; 257/714, 715; 361/687, 699, 700–704, 710, 717–721

[56] References Cited

U.S. PATENT DOCUMENTS

| | | | |
|---|---|---|---|
| 4,118,756 | 10/1978 | Nelson et al. ........................... | 361/700 |
| 5,095,404 | 3/1992 | Chao ....................................... | 361/700 |
| 5,409,055 | 4/1995 | Tanaka et al. .......................... | 361/700 |
| 5,465,782 | 11/1995 | Sun et al. ........................... | 165/104.26 |
| 5,694,295 | 12/1997 | Mochizuki et al. .................... | 174/15.2 |

OTHER PUBLICATIONS

IBM Tech Discl. Bulletin, Patch et al, "Conduction Cooled Heat Plate For Modular Circuit Package", vol. 13, No. 2, Jul. 1970, p. 442.

*Primary Examiner*—Gregory Thompson
*Attorney, Agent, or Firm*—David J. Kaplan

[57] ABSTRACT

A lid that provides thermal dissipation for an integrated circuit. The lid is designed to be fastened to a printed circuit board and includes a casing having thermally conductive upper and lower plates. Between the upper and lower plates, inside the casing, is a hollow interior region within which vaporizing fluid and two or more segments of wick reside.

18 Claims, 3 Drawing Sheets nsELECTRONIC COMPONENT LID THAT PROVIDES IMPROVED THERMAL DISSIPATION

FIELD OF THE INVENTION

The present invention relates to computer systems and more particularly to thermal dissipation of the heat generated by integrated circuits in a computer system.

BACKGROUND OF THE INVENTION

Computer systems typically contain one or more integrated circuits (ICs). High-speed ICs that consume a lot of power (on the order of a few Watts or more), such as, for example, processors and controllers, require that the heat generated by the IC be conducted away from the IC and dissipated. If the heat generated by the IC is not removed, performance of the IC is degraded. In some cases, an IC can become so hot that it will actually destroy itself, causing the computer system to stop functioning. Therefore, it is necessary to design heat removal systems into computer systems that use high power ICs such as processors.

A heat removal system typically comprises two main parts, a thermal block and a heat sink. A thermal block is the portion of the heat removal system that conducts heat from the IC and transfers the heat to the heat sink. A thermal block is typically highly thermally conductive, comprising a large, solid mass of metal such as copper or aluminum, for efficient transfer of the heat from the IC to the heat sink.

A heat sink is the portion of the heat removal system that dissipates the heat conducted from the IC (via the thermal block) to the ambient environment. A heat sink dissipates heat by either increasing the surface area for the heat to dissipate from, increasing air flow (or liquid flow) across a heated surface, or both. Some heat sinks include fins and heat spreader plates that increase heat dissipation surface area. Other heat sinks use a fan to blow air across a surface.

Some ICs are sold to computer system manufacturers prepackaged under thin metal lids that provide physical protection for the IC and shield the IC from electromagnetic interference. The IC typically arrives already thermally coupled to the metal lid, and the system manufacturer is responsible for then thermally coupling the metal lid to a thermal block, which is thermally coupled to a heat sink inside the computer system. Because the metal lid represents an intermediate thermal coupling between the IC and the thermal block, the thermal resistivity contributed by the thin metal lid degrades the overall efficiency of the heat removal system. This represents a reliability concern. In addition, for mobile computer systems, such as laptop, notebook, subnotebook, and personal data assistants, space and weight constraints can severely limit the use of bulky, heavy thermal blocks.

SUMMARY OF THE INVENTION

A lid is described that provides thermal dissipation for an integrated circuit. The lid is designed to be fastened to a printed circuit board and includes a casing having thermally conductive upper and lower plates. Between the upper and lower plates, inside the casing, is a hollow interior region within which vaporizing fluid and two or more segments of wick reside.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A lid is described that provides thermal dissipation for an electronic component. In accordance with one embodiment of the present invention, the electronic component includes a printed circuit board (PCB) that includes several integrated circuits (ICs) along with the associated interconnect lines that couple the ICs to one another. One of the ICs is a processor solder-bonded to a package which is solder-bonded to the PCB for electrical coupling between the PCB and the IC. The processor, being a high-power IC, requires heat dissipation. Other ICs electrically coupled to the PCB of the electronic component may also require heat dissipation.

To provide heat dissipation, as well as physical and electromagnetic protection for the processor and other ICs electrically coupled to the PCB, a thermally conductive lid is fastened to the PCB. The lid has a hollow interior region containing two or more wick segments and a vaporizing fluid. The lid provides highly efficient thermal dissipation. Because the lid operates on a principle similar to a heat pipe—that of vaporization, condensation, and capillary action—the lid is referred to as a flat heat pipe.

For one embodiment, the processor is thermally coupled to the lid. For another embodiment, the processor is exposed through a through-hole in the lid. A computer system manufacturer provided with this electronic component may provide efficient thermal dissipation for the processor by thermally coupling a heat sink (or a thermal block thermally coupled to a heat sink) to the lid and, if exposed, to the processor itself. The high thermal conductivity of the lid of the electronic component improves the efficiency of the overall thermal dissipation of the computer system. In addition, because the lid of the present invention is hollow, it is lightweight, making this invention attractive for use in mobile computer systems.

A more detailed description of the present invention, including various configurations and implementations in accordance with alternate embodiments of the present invention, is provided below.

Figure 1:
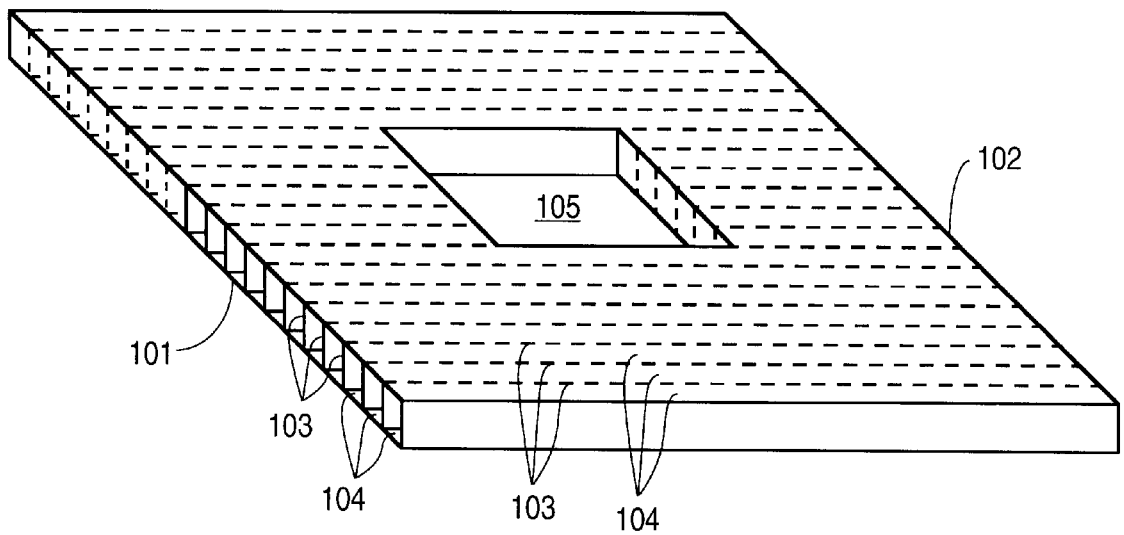
FIG. 1 is a flat heat pipe formed in accordance with an embodiment of the present invention.

FIG. 1 is a flat heat pipe formed in accordance with one embodiment of the present invention. The flat heat pipe includes a sealed casing comprising a lower plate 101 and an upper plate 102. Between the lower and upper plates is a hollow interior region within which an arrangement of approximately parallel wick segments 103 reside. Between wick segments 103 are vapor channels 104. Wick segments 103 are shown as the walls that separate adjacent vapor channels 104. In addition, the hollow region is partially filled with a two-phase vaporizable fluid. In accordance with one embodiment of the present invention, through-hole 105 has been formed in the approximate center of the flat heat pipe, through both lower plate 101 and upper plate 102.

When the flat heat pipe of FIG. 1 is heated, the vaporizing fluid inside the hollow region of the flat heat pipe nearest the heat source vaporizes, absorbing heat in that region. This vaporization increases the pressure in the heated region of the flat heat pipe. The pressure differential causes the vaporized fluid to be pumped along vapor channels from the heated region to cooler regions within the flat heat pipe interior, thereby quickly spreading the heat along the flat heat pipe. Upon reaching a cooler region, the vaporizing fluid condenses back into the liquid phase, whereupon the capillary action of the wick segments cause the condensed fluid to flow back to the heat source. This cycle of vaporization, condensation, and capillary feedback of the vaporizing fluid efficiently and quickly spreads heat throughout the flat heat pipe.

To improve the efficiency of the flat heat pipe of FIG. 1, lower plate 101 and upper plate 102 are made of a highly thermally conductive material such as copper or an alloy thereof. For an alternate embodiment, the weight of the flat heat pipe is reduced by implementing a lighter, thermally conductive material such as aluminum or an alloy thereof. This embodiment may be found useful in mobile applications where weight reduction is a primary concern.

Wick segments 103 of the flat heat pipe of FIG. 1 comprise grooves along rigid, thermally conductive walls within the hollow interior region of the casing. For an alternate embodiment, the wick may include a wire mesh or any other porous material. Freon or a freon substitute may be used as the vaporizing fluid. Alternatively, for an embodiment in which copper is selected as the casing material, water may be used as the vaporizing material. For alternate embodiments, other vaporizing fluids may be used.

In accordance with an alternate embodiment of the present invention, a flat heat pipe is formed by combining an array of small, adjacent, parallel, heat pipes, each heat pipe having an approximately circular, elliptical, or rectangular cross section and independently sealed from one another.

Figure 2:
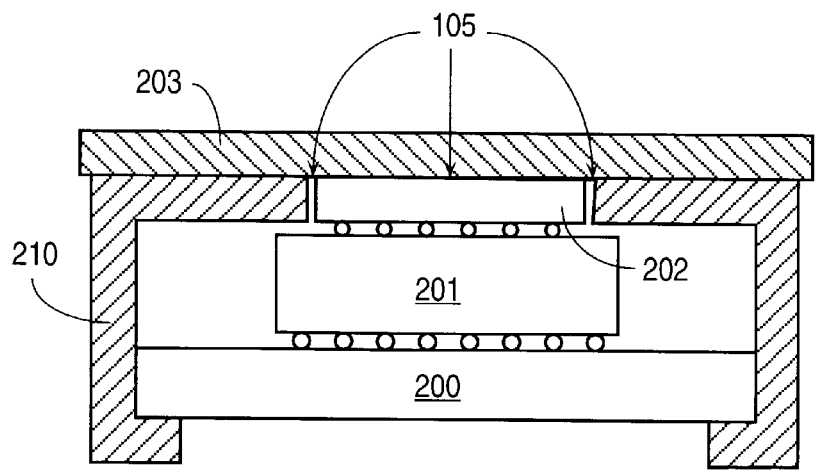
FIG. 2 is a cross section of the flat heat pipe of FIG. 1 formed into a lid for an integrated circuit of an electronic component.

FIG. 2 is a cross section of the flat heat pipe of FIG. 1 formed into a lid 210 for one or more ICs of an electronic component. The electronic component comprises lid 210, IC 202 received within through-hole 105 and solder bonded to IC package substrate 201, and PCB 200 to which lid 210 is fastened and package substrate 201 is solder bonded. The electronic component is thermally coupled to a thermally conductive plate 203. Thermally conductive plate 203 is also thermally coupled to IC 202. A thermal grease or other suitable interface material is used at the interface between thermally conductive plate 203 and IC 202, as well as between plate 203 and lid 210. The interface material fills in any gaps at the interface to provide better thermal coupling.

In accordance with one embodiment of the present invention, IC 202 of FIG. 2 is a processor. For an alternate embodiment, any other IC that requires thermal dissipation, such as a chipset, may be implemented in accordance with the present invention. Plate 203 is a spreader plate that transfers heat conducted from IC 202 to lid 210, the ambient, and any other thermally conductive devices coupled to plate 203. Lid 210 wraps around the outer edges of PCB 200, as shown, to fasten the lid to the PCB and to provide thermal coupling between PCB 200 and lid 210. In this manner, lid 210 dissipates heat from the PCB as well as heat from the IC. For one embodiment, the wick segments and vapor channels of the lid extend throughout the lid. For an alternate embodiment, the wick segments and vapor channels are isolated to a particular region of the lid. For example, for one embodiment the portion of lid 210 that wraps around PCB 200 is free of wick segments and vapor channels.

Because lid 210 of FIG. 2 includes a hollow region, lid 210 is lightweight. Providing through-hole 105 to receive IC 202 allows the thickness of this electronic component to be reduced in comparison to a component having a lid that entirely encloses the IC. As a result of its light weight and small form factor, the electronic component of FIG. 2 is attractive for applications in mobile computer systems.

For an embodiment of the present invention in which the electronic component comprising PCB 200, IC 202, IC package 201, and lid 210 is implemented in a mobile computer system, spreader plate 203 may form the keyboard support plate of the system. For this embodiment, spreader plate 203 dissipates heat to the ambient through the keyboard of the mobile computer system. For an alternate embodiment of the present invention, the thermally conductive plate that is coupled to the IC and to the top of the lid is a thermal block thermally coupled to a heat sink or a heat pipe. For another embodiment, the thermally conductive plate is a second flat heat pipe.

Lid 210 of FIG. 2 is more efficient at conducting heat across its surface than conventional lids formed of thin sheet metal. Also, in accordance with an embodiment of the present invention in which the PCB to which the lid is fastened contains other ICs that would benefit from heat dissipation, the additional ICs are thermally coupled to the underside of lid 210 either directly or via a small thermal block.

In accordance with an alternate embodiment of the present invention, a flat heat pipe without any through-hole is used to form the lid of an electronic component. For this embodiment, the IC that requires thermal dissipation is thermally coupled to the underside of the lid. This embodiment is described in more detail below in conjunction with FIG. 4.

Figure 3:
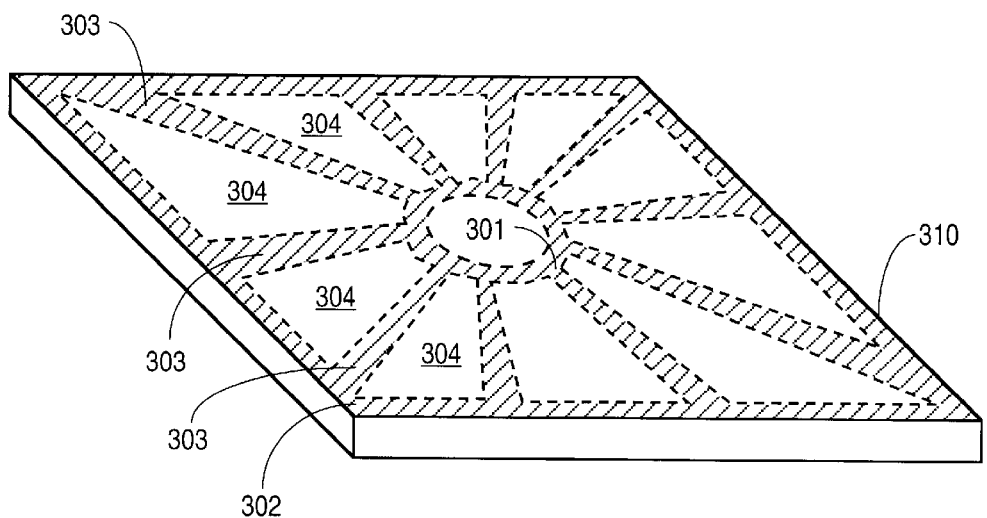
FIG. 3 is a flat heat pipe formed in accordance with an alternate embodiment of the present invention.

FIG. 3 is a flat heat pipe formed in accordance with an alternate embodiment of the present invention. The flat heat pipe includes a sealed casing 310 with a hollow interior region containing an inner wick ring 301 located at the approximate center of the flat heat pipe, an outer wick ring 302, and an arrangement of wick segments 303 that radiate out from the approximate center of the flat heat pipe, connecting inner wick ring 301 to outer wick ring 302. Between wick segments 303 are vapor channels 304, and, in addition, the hollow region is partially filled with a two-phase vaporizable fluid.

The flat heat pipe of FIG. 3 operates in much the same manner as the flat heat pipe of FIG. 1. For example, as the flat heat pipe of FIG. 3 is heated near the center of the structure, the vaporizing fluid inside the hollow region of the flat heat pipe near inner wick ring 301 vaporizes, absorbing heat in that region. This vaporization increases the pressure near inner wick ring 301, causing the vaporized fluid to be pumped through vapor channels 304 to the cooler regions near outer wick ring 302, thereby quickly spreading the heat along the flat heat pipe. At or near outer wick ring 302 the vaporizing fluid re-condenses, whereupon the capillary action of the wick segments cause the condensed fluid to flow from outer wick ring 302, along wick segments 303, back to the heat source at inner wick ring 301.

Figure 4:
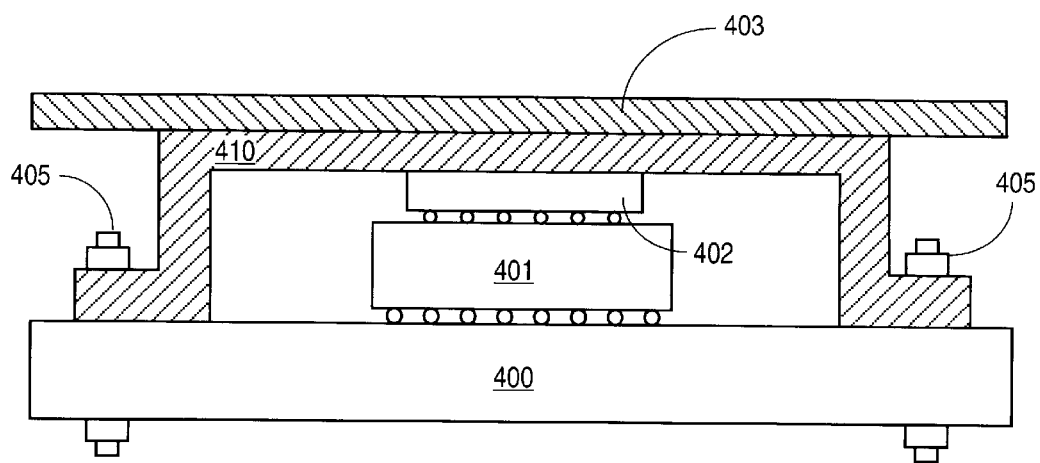
FIG. 4 is a cross section of the flat heat pipe of FIG. 3 formed into a lid for an integrated circuit of an electronic component.

FIG. 4 is a cross section of the flat heat pipe of FIG. 3 formed into a lid 410 for one or more ICs of an electronic component. The electronic component comprises lid 410, IC 402 solder bonded to IC package substrate 401, and PCB 400 to which lid 410 is fastened and package substrate 401 is solder bonded. The electronic component is thermally coupled to a thermally conductive plate 403. A thermal grease or other interface material is used at the interface between thermally conductive plate 403 and lid 410. In addition, IC 402 is thermally coupled, via an interface material, to the underside of lid 410. The interface material fills in any gaps at the interface to provide better thermal coupling. Lid 410 is fastened to PCB 400 using fasteners 405.

In accordance with one embodiment of the present invention, IC 402 of FIG. 4 is a processor. For an alternate embodiment, any other IC that requires thermal dissipation, such as a chipset, is implemented using lid 410. Plate 403 is a spreader plate that transfers heat conducted from IC 402 via lid 410 to the ambient and any other thermally conductive devices coupled to plate 403. Lid 410 is fastened to the outer edges of PCB 400 using fasteners 405, as shown, to provide thermal coupling between PCB 400 and lid 410. In this manner, lid 410 dissipates heat from PCB 400 as well as heat from IC 402.

For an embodiment of the present invention in which the electronic component of FIG. 4 comprising PCB 400, IC 402, IC package 401, and lid 410 is implemented in a mobile computer system, spreader plate 403 may form the keyboard support plate of the system and dissipate heat to the ambient through the keyboard of the mobile computer system. For an alternate embodiment of the present invention, the thermally conductive plate coupled to the top of the lid is a thermal block thermally coupled to a heat sink or a heat pipe. For another embodiment, the thermally conductive plate is a second flat heat pipe.

Lid 410 of FIG. 4 is more efficient at conducting heat across its surface than conventional lids formed of thin sheet metal. Also, in accordance with an embodiment of the present invention in which the PCB to which the lid is fastened contains other ICs that would benefit from heat dissipation, the additional ICs are thermally coupled to the underside of lid 410 either directly or via a small thermal block.

Because a heat sink thermally coupled directly to an IC may be more efficient at heat removal than a heat sink thermally coupled to the lid, the electronic component of FIG. 4 may not be as thermally efficient at removing heat from the IC as the electronic component of FIG. 2. The electronic component of FIG. 4, however, has other advantages that might make it more attractive to a system designer for particular applications. For example, the embodiment of the present invention shown in FIG. 4, in which no through-hole is formed in the lid, may be found to have lower manufacturing costs, making this embodiment attractive for use in computer systems for which cost constraints are a primary concern. In addition, this embodiment provides for better physical protection of the IC and other devices electrically coupled to the PCB of the electronic component.

The thickness of the electronic component of FIG. 4, as measured from the bottom of PCB 400 to the top of lid 410, is thicker than the electronic component of FIG. 2 as measured from the bottom of PCB 200 to the top of lid 210. As a result, the embodiment of the present invention in which a through-hole is formed in the lid to receive the IC of the electronic component, as shown in FIG. 2, or the embodiment in which a recessed cavity is formed in the lid to receive the IC (described below in conjunction with FIG. 6), may be more suitable for applications in which space constraints are a primary concern, such as for mobile computer applications.

In accordance with an alternate embodiment of the present invention, the flat heat pipe of FIG. 3, and, consequently, the lid of FIG. 4, is modified to include a recessed cavity or a through-hole. For one embodiment, the inner wick ring follows the perimeter of the recessed cavity or through-hole.

Figure 5:
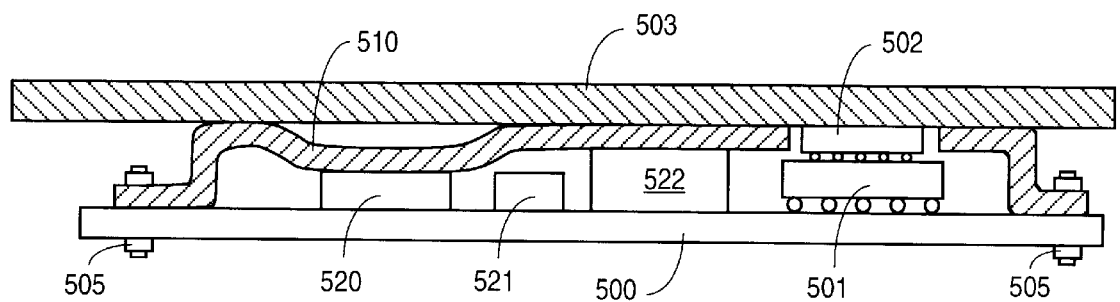
FIG. 5 is a cross section of a flat heat pipe formed into a lid for a plurality of integrated circuits of an electronic component in accordance with another embodiment of the present invention.

FIG. 5 is a cross section of a flat heat pipe formed into a lid 510 for two or more ICs of an electronic component in accordance with one embodiment of the present invention. The electronic component comprises lid 510, processor 502 solder bonded to package substrate 501, additional ICs 520–522, and PCB 500 to which lid 510 is fastened and package substrate 501 is solder bonded. ICs 520–522 and processor 502 are electrically coupled to each other via interconnects on PCB 500. Lid 510 is thermally coupled to a thermally conductive plate 503, as is processor 502 through a through-hole in lid 510. A thermal grease or other interface material is used at the interface between thermally conductive plate 503 and lid 510 as well as between plate 503 and processor 502. In addition, IC 520 and IC 522 are thermally coupled, via an interface material, to the underside of lid 510. Lid 510 is fastened to PCB 500 using fasteners 505.

In accordance with one embodiment of the present invention, IC 520 and IC 522 of FIG. 5 are ICs that benefit from the thermal dissipation provided by lid 510. For example, for one embodiment IC 520 is a chipset and IC 522 is a controller. Because ICs 520 and 522 can benefit from thermal dissipation, and these ICs are different heights, lid 510 is contoured to ensure thermal coupling to the surfaces of ICs 520 and 522 on PCB 500. This contouring of lid 510 causes a physical gap between lid 510 and plate 503 over IC 520. Because lid 510 is thermally efficient at quickly spreading heat throughout the casing, however, this gap does not impair thermal coupling between lid 510 and plate 503 in comparison to a similar gap between a conventional thin sheet metal lid and a plate. As a result, adequate thermal dissipation is provided to IC 520 even though lid 510 is not in direct contact with plate 503 in the region above IC 520.

For an alternate embodiment of the present, the gap between the lid and the plate shown in FIG. 5 is eliminated by flattening the lid and thermally coupling ICs to the underside of the lid either directly or via a thermal block if the IC is not high enough to reach the underside of the lid. IC 521 does not generate enough heat to require thermal dissipation, so IC 521 is not thermally coupled to the underside of lid 510.

Plate 503 of FIG. 5 is a spreader plate that transfers heat conducted from lid 510 and processor 502 to the ambient and any other thermally conductive devices coupled to plate 503. Lid 510 is fastened to the outer edges of PCB 500 using fasteners 505, as shown, to provide thermal coupling between PCB 500 and lid 510. In this manner, lid 510 dissipates heat from the PCB as well as heat from the ICs.

For an embodiment of the present invention in which the electronic component of FIG. 5 comprising PCB 500, processor 502, package substrate 501, ICs 520, 521, and 522, and lid 510 is implemented in a mobile computer system, spreader plate 503 may form the keyboard support plate of the system and dissipate heat to the ambient through the keyboard of the mobile computer system. For an alternate embodiment of the present invention, the thermally conductive plate coupled to the top of the lid is a thermal block thermally coupled to a heat sink or a heat pipe. For another embodiment, the thermally conductive plate is a second flat heat pipe.

In accordance with an alternate embodiment of the present invention, the lid of FIG. 5 is modified to enclose the processor under the lid within the electronic component, and the processor is thermally coupled to the underside of the lid. For another embodiment, the processor is enclosed under the lid within the electronic component, and the lid includes a recessed cavity to receive the processor.

Figure 6:
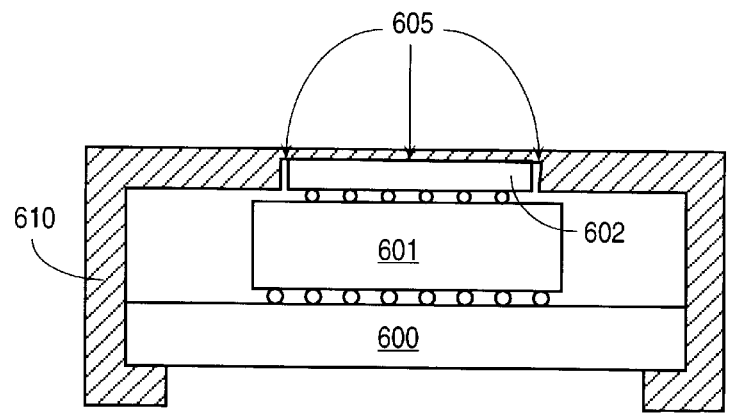
FIG. 6 is a cross section of a flat heat pipe formed into a lid for an integrated circuit of an electronic component in accordance with another embodiment of the present invention.

FIG. 6 is a cross section of a flat heat pipe formed into lid 610 for an integrated circuit 602 of an electronic component in accordance with another embodiment of the present invention. For this embodiment, a through-hole of a lid is modified so that the upper plate of the flat heat pipe casing of the lid is solid, and the lower plate includes recessed cavity 605 in the approximate center of the plate. Lid 610 is affixed to PCB 600 to which IC package 601 and, for alternate embodiments, other electronic devices are coupled. For this embodiment, IC 602 is thermally coupled to the lid within recessed cavity 605 of the lid. In comparison to the embodiment of FIG. 2, the embodiment of FIG. 6 reduces or eliminates the need to have a separate spreader plate thermally coupled to the lid and the IC to spread heat from the IC to the lid. Another advantage to the embodiment of FIG. 6 is that lid 610 provides better physical protection to IC 602 and package substrate 601 because lid 610 fully encloses the IC and package within the electronic component.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A lid for an electronic component, the electronic component including an integrated circuit (IC), the lid comprising:
   a casing to fasten to a printed circuit board, the casing comprising thermally conductive upper and lower plates and having a through-hole to receive the IC;
   a hollow interior region disposed within the casing between the upper and lower plates;
   a plurality of wick segments disposed within the hollow region; and
   a vaporizing fluid disposed within the hollow region.

2. The lid of claim 1, wherein the thermally conductive upper and lower plates comprise a material selected from the group consisting of aluminum and copper.

3. The lid of claim 1, wherein the plurality of wick segments are arranged approximately parallel to each other.

4. The lid of claim 1, wherein the plurality of wick segments are arranged to radiate out from an approximate center of the lid.

5. An electronic component comprising:
   a printed circuit board (PCB);
   a first integrated circuit (IC) electrically coupled to the PCB; and
   a lid fastened to the PCB, the lid comprising a hollow interior region containing a plurality of wick segments and a vaporizing fluid, and including a through-hole through which the first IC is exposed.

6. The electronic component of claim 5, further comprising a second IC electrically coupled to the PCB and thermally coupled to the lid.

7. The electronic component of claim 5, wherein the first IC is a processor.

8. The electronic component of claim 5, wherein the first IC is thermally coupled to the lid.

9. The electronic component of claim 5, wherein the plurality of wick segments are arranged approximately parallel to each other.

10. The electronic component of claim 5, wherein the plurality of wick segments are arranged to radiate out from an approximate center of the lid.

11. A computer system comprising:
    a printed circuit board (PCB);
    a processor electrically coupled to the PCB;
    a lid fastened to the PCB, the lid comprising a hollow interior region containing a plurality of wick segments and a vaporizing fluid, the lid having a contour to accommodate thermal coupling to the IC; and
    a spreader plate thermally coupled to the lid, the contour causing a gap between the lid and the spreader plate.

12. The computer system of claim 11, further comprising an IC electrically coupled to the PCB and thermally coupled to the lid.

13. The computer system of claim 11, wherein the processor is exposed through a through-hole in the lid and the spreader plate is thermally coupled to the processor.

14. The computer system of claim 11, wherein the lid comprises a recessed cavity in which the processor is disposed and is thermally coupled to the lid.

15. The computer system of claim 11, wherein the processor is thermally coupled to the lid.

16. The computer system of claim 15, wherein the plurality of wick segments are arranged approximately parallel to each other.

17. The computer system of claim 15, wherein the plurality of wick segments are arranged to radiate out from an approximate center of the lid.

18. The computer system of claim 15, wherein the spreader plate dissipates heat through a keyboard of the computer system.

* * * * *